(12) United States Patent
Baumgart

(10) Patent No.: US 6,294,919 B1
(45) Date of Patent: Sep. 25, 2001

(54) METHOD FOR NONDESTRUCTIVE MEASUREMENT OF DOPANT CONCENTRATIONS AND PROFILES IN THE DRIFT REGION OF CERTAIN SEMICONDUCTOR DEVICES

(75) Inventor: Helmut Baumgart, Mahopac, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/266,038

(22) Filed: Mar. 11, 1999

Related U.S. Application Data

(60) Provisional application No. 60/079,720, filed on Mar. 27, 1998.

(51) Int. Cl.[7] ................................................. G01R 31/28
(52) U.S. Cl. ................................................. 324/752; 324/765
(58) Field of Search ........................... 324/158.1, 73.1, 324/96, 750, 752, 751, 765, 766, 719; 438/14, 17, 18, 468; 257/40, 48

(56) References Cited

U.S. PATENT DOCUMENTS

| | | | |
|---|---|---|---|
| 4,456,979 | * 6/1984 | Kleinknecht | 324/71.5 |
| 4,827,212 | * 5/1989 | Kamieniecki | 324/752 |
| 5,413,942 | * 5/1995 | Cahen et al. | 438/468 |
| 5,840,980 | * 9/1998 | Nikawa | 324/752 |

\* cited by examiner

Primary Examiner—Vinh P. Nguyen
(74) Attorney, Agent, or Firm—Irwin Ostroff; Edward Brandeau

(57) ABSTRACT

A method is provided for determining dopant impurity concentration $N_D$ in certain semiconductor devices, such as high voltage lateral double diffused metal oxide semiconductor (HV LDMOS) transistors. Such a device is scanned along its length by a beam of radiant energy (e.g., a laser beam focused through a microscope onto the device) while the device is reverse biased by a voltage V. A resulting beam induced current signal measures a depletion width W, for a given bias voltage V, the widths W increasing with increasing bias voltages V. From a series of respective voltages V and widths W a profile of corresponding dopant concentrations $N_D$ is determined using a suitable mathematical algorithm.

8 Claims, 3 Drawing Sheets

METHOD FOR NONDESTRUCTIVE MEASUREMENT OF DOPANT CONCENTRATIONS AND PROFILES IN THE DRIFT REGION OF CERTAIN SEMICONDUCTOR DEVICES

CROSS-REFERENCE TO RELATED APPLICATIONS

This application is related to and derived from Provisional Application Ser. No. 60/079,720, filed Mar. 27, 1998, in which the inventorship and assignee are the same as herein.

FIELD OF THE INVENTION

This invention relates to a method for non-destructive measurement by means of a beam of radiant energy, and a corresponding induced signal current, dopant impurity concentrations which may vary along the length of certain semiconductor devices, such as lateral double diffused metal oxide semiconductor (LDMOS) transistors which are designed for high voltage (HV) applications.

BACKGROUND OF THE INVENTION

It is well known that an induced current can be generated in a semiconductor having a p-n junction or Schottky Barrier (metal-semiconductor rectifying contact) by shining a focused beam of radiation of above bandgap energy on the body of the semiconductor. Apparatus for generating such beams and for scanning them across a device under test (DUT) are commercially available. In the case of a large area device, such as a high-voltage HV LDMOS transistor (which typically is ten or more microns in length) it is convenient to use a laser beam focused through an optical microscope to illuminate and scan the device. It is to be understood however that other radiant energy beams, such as an electron beam (EBIC), can be used for this purpose and are the method of choice for small electronic devices.

High voltage HV LDMOS devices, particularly those fabricated utilizing the reduced surface electric field (RESURF) principle, generally require very specific (e.g., linearly increasing) doping profiles in the drift region of the device. A voltage-capacitance relationship internally of a LDMOS transistor determines a space charge region depletion width "W" in the transistor as a function of an applied reverse bias voltage as the transistor is scanned by a laser (or other radiant energy) beam. This reverse bias voltage determines how many trapped positive (donor) ions can be uncovered in the graded-dopant n-type drift region of the transistor and results in a fixed depletion width W for each applied voltage. As will be explained in greater detail hereinafter a beam-induced photocurrent signal from the LDMOS device under reverse bias allows the measurement of the depletion width W as a function of applied reverse bias voltage.

It is desirable to be able to make quick, accurate and non-destructive measurement of dopant impurity concentrations and profiles along the length of certain semiconductor devices such as LDMOS transistors. This provides for the rapid monitoring of the design and functionality, and the manufacturing processes for such devices. Prior to the invention, so far as is known, no one had utilized a radiant beam scanning system for such measurements.

SUMMARY OF THE INVENTION

In accordance with one illustrative embodiment of apparatus for carrying out the method of measurement provided by the invention, a device under test (DUT) such as a high voltage HV LDMOS transistor, is reverse biased and is scanned along its drift region length by a laser beam of suitable wavelength and intensity, focused onto the DUT through a microscope. An optical beam induced current (OBIC) signal is obtained and by the amplitude of the OBIC signal and the beam position along the length of the DUT a respective depletion width (W) is determined for each of a number of values of reverse bias voltage. From these measurements the corresponding dopant impurity concentration (e.g., of phosphorous atoms) for each measured depletion width W is obtained using a mathematical algorithm. This allows determination of a profile of the dopant impurity concentrations as a function of drift region distance or depletion width W in the LDMOS device.

An OBIC laser-microscope system does not directly measure internal capacitance of the p-n junction between p+ body and n-type drift region of an LDMOS transistor by conventional electrical measurements, but measures instead the depletion layer capacitance via the space charge region depletion width W. This is another way of measuring the junction depletion layer capacitance resulting from the fixed charge of the uncovered ionized impurity atoms in the space charge region. A mathematical equation (described in detail hereinafter) is formulated in a way applicable to the case of OBIC measurements of the DUT to describe the incremental junction capacitance as a function of reverse bias voltage in terms of the space charge region depletion width W and its derivatives.

For a high voltage HV LDMOS transistor, where the RESURF condition is utilized, the situation is more complex. In a RESURF device the space charge region is further extended in order to achieve higher breakdown voltages by simultaneously depleting vertically from the p-n junction in the device and also horizontally from a substrate oxide layer via an MOS capacitance for the given example of an HV LDMOS device fabricated in SOI (silicon-on insulator) technology. Here the added MOS capacitance from the substrate (consisting of the oxide layer capacitance and the depletion layer capacitance in series) lies in parallel with the depletion layer capacitance of the p-n junction between the p+type body and n-type drift region as will be described hereinafter. The depletion layer capacitance of the p-n junction gives only a negligible contribution in this case, since the area of the p-n junction capacitor is negligibly small in comparison with the oxide layer capacitance. In other words, the MOS capacitance formed by the device substrate and the insulating oxide layer completely dominates the depletion width W in the drift region of the device. Accordingly, as will be explained hereinafter, a further extended mathematical algorithm is derived by means of which are determined in accordance with the invention dopant impurity concentrations in HV LDMOS transistors in SOI technology utilizing the RESURF principle.

In accordance with an aspect of the invention there is provided a method for non-destructive measurement of dopant concentrations in the drift region of semiconductor devices, such as LDMOS transistors. The method comprises a first step of reverse biasing a device under test (DUT) with a first voltage, a second step of scanning the device with a beam of radiant energy to induce in the DUT a signal current which varies as the beam scans along the DUT and is used to measure a first depletion width (W) in the DUT, additional steps of repeating the first and second steps using a plurality of separate bias voltages and measuring respective depletion widths W in the DUT, and a final step of determining from the voltages and the widths W a profile of dopant impurity concentrations in the DUT.

In accordance with another aspect of the invention there is provided a method for determining dopant impurity concentrations ($N_D$) at points along the length of a semiconductor device such as a high voltage lateral double diffused metal oxide semiconductor (HV LDMOS) transistor which has internal capacitance (C). The method comprises the steps of: reverse biasing the device with a voltage V which can be varied over a wide range until the onset of avalanche breakdown of the device; scanning along a length of the device with a beam of radiant energy to produce in the device a beam induced current signal; using the induced signal to measure a depletion width W in the device for a respective voltage V, the induced OBIC photocurrent signal having a high generally constant value within a region of the depletion width W and decaying generally to zero outside the region, the depletion width W increasing as bias voltage V in increased; repeating the above steps with different bias voltages to establish a series of such voltages V and respective widths W; and determining from interrelationships of voltage V, width W, capacitance (C) and dopant concentration $N_D$ the respective dopant concentrations ND at points along the length of the device.

A better understanding of the invention together with a fuller appreciation of its many advantages will best be gained from a study of the following description and claims given in conjunction with the accompanying drawings.

DETAILED DESCRIPTION

Figure 1:
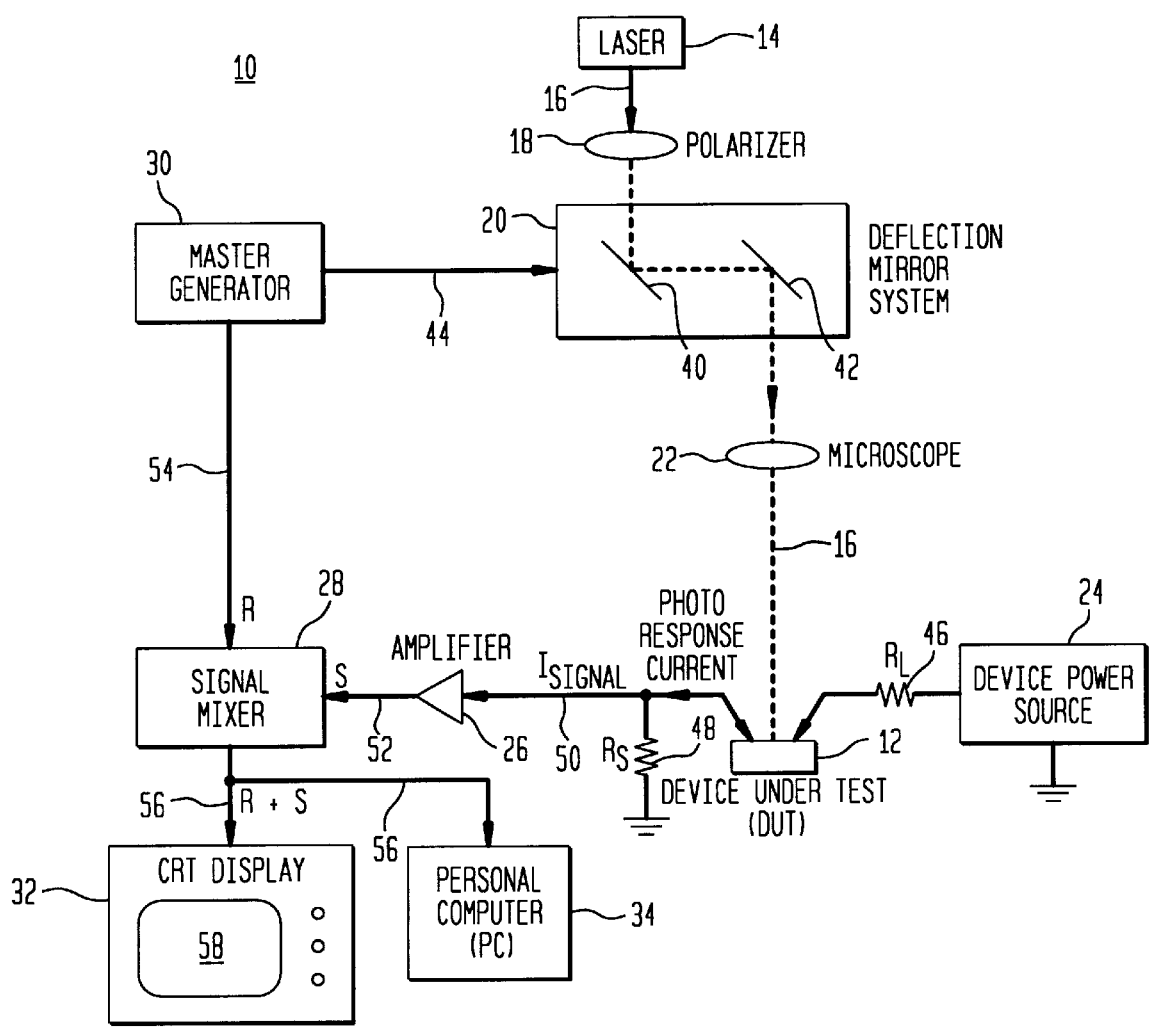
FIG. 1 is a schematic illustration partly in block diagram form of apparatus for scanning a semiconductor device under test (DUT), such as a HV LDMOS transistor, and for generating optical beam induced current (OBIC) in the DUT to determine in accordance with the method of the invention dopant impurity concentrations along the length of the DUT.

Referring now to FIG. 1, there is shown an optical beam scanning apparatus 10 utilized in accordance with a method of the present invention to measure dopant concentrations along the length of a semiconductor device under test (DUT) 12, such as a HV LDMOS transistor. The apparatus 10 comprises a laser 14 which emits a beam 16, a polarizer 18, a deflection mirror system 20, a microscope 22 which focuses the beam 16 in a fine spot on the DUT 12, a power source 24, a signal amplifier 26, a signal mixer 28, a raster generator 30, a cathode ray tube (CRT) display 32, and a personal computer (PC) 34. While individual elements of the apparatus 10 are well known in the art, they are utilized in accordance with the method of the present invention in a unique way to measure dopant impurity concentrations along the length of the DUT 12, as will be explained in detail hereinafter. It is to be understood that the invention is not limited solely to use of optical beams but applies equally well to use of electron beams with a SEM (scanning electron microscope) for EBIC.

The laser 14 emits a beam 16 of light with a wavelength, for example, of 633 nanometers (nm) and of suitable intensity (e.g., several watts). The beam 16 passes through a polarizer 18 and into the deflection mirror system 20. The mirror system 20 includes a plurality of moveable mirrors 40 and 42 which are driven back and forth by electrical signals received via a lead 44 from the raster generator 30. Mechanical movement of the mirrors 40 and 42 deflects the beam 16 back-and-forth and side-to-side in synchronism with electrical signals from the generator 30 as is well known. The beam 16 passes from the deflection mirror system 20 and into the microscope 22 which focuses the beam 16 into a fine spot (e.g., about a micron in diameter) onto a surface of the DUT 12. This results in optical beam induced current (OBIC) in the DUT 12. The beam 16 as it is being deflected by the deflection system 20 thus scans line by line along a length of the DUT 12 and is synchronized with the CRT signal display.

During scanning by the beam 16, the DUT 12 is reverse biased by a positive voltage (+V) from the power source 24, a negative side of which is grounded, and a load resistor ($R_L$) 46. A photo-response current passes from the DUT 12 through a sensing resistor ($R_S$) 48 to ground. A signal, termed "Isignal" is applied from the sensing resistor 48 via a lead 50 to an input of the amplifier 26, an output of which is applied via a lead 52 to one input (S) of the signal mixer 28. A raster signal is applied to another input (R) of the signal mixer 28 via a lead 54 from the raster generator 30. Dual signals (R+S) from the signal mixer 28 are applied via a common connection 56 to an input of the CRT display 32 where the signals are displayed on a screen 58 as a waveform (to be discussed hereinafter) having the usual x and y coordinates. The dual R+S signals on the common connection 56 are also applied to the personal computer 32 where they are processed and the dopant impurity concentrations along the length of the DUT 12 are obtained, as will be explained hereinafter.

Figure 2:
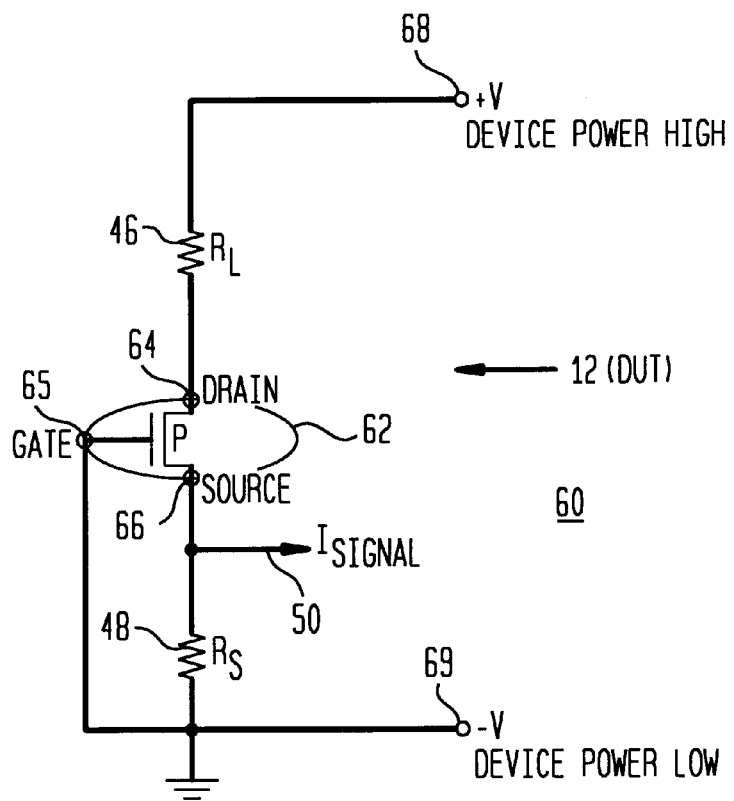
FIG. 2 is a circuit diagram showing how a semiconductor DUT, such as shown in FIG. 1, is reverse biased during measurement.

Referring now to FIG. 2, there is shown a schematic circuit diagram 60 showing electrical connections to the DUT 12 of FIG. 1. As seen in the diagram 60, the DUT 12 is, by way of example, a HV LDMOS P channel transistor 62 having a drain 64, a gate 65, and a source 66. It is to be understood, however, that the DUT 12 may be a semiconductor other than the transistor 62 shown here (see, for example, FIG. 5). The transistor 62 while being scanned by the beam 16 is reverse-biased with its drain 64 connected via the load resistor ($R_L$) 46 (see FIG. 1) to a positive terminal 68(+V) of the power supply 24 (not shown here but shown in FIG. 1), the negative side of the supply being connected to a terminal 69 and to ground. The gate 65 of the transistor 62 is connected directly to ground and the terminal 69 (−V) which is shown connected to ground while the source 66 is connected via the sensing resistor ($R_S$) 48 to ground. A voltage across the sensing resistor 48 is proportional to OBIC current as the DUT 12 is scanned by the beam 16, as was previously explained. This voltage is applied to the lead 50 (see FIG. 1) and is termed "Isignal" The supply voltage +V can be varied over a wide range until the onset of avalanche breakdown of the particular device. By way of illustration, the resistor ($R_L$) 46 may have a value of 100 K ohms, the resistor ($R_S$) 48 a value of 10 K ohms, and the resistance in reverse bias across the drain 64 and the source 66 of the transistor 62 may be approximately 100 M ohms. The relative sizes of these resistances result in the voltage at the drain 64 of the transistor 62 being substantially at the supply voltage +V, and the source 66 being substantially at ground (−V).

Figure 3:
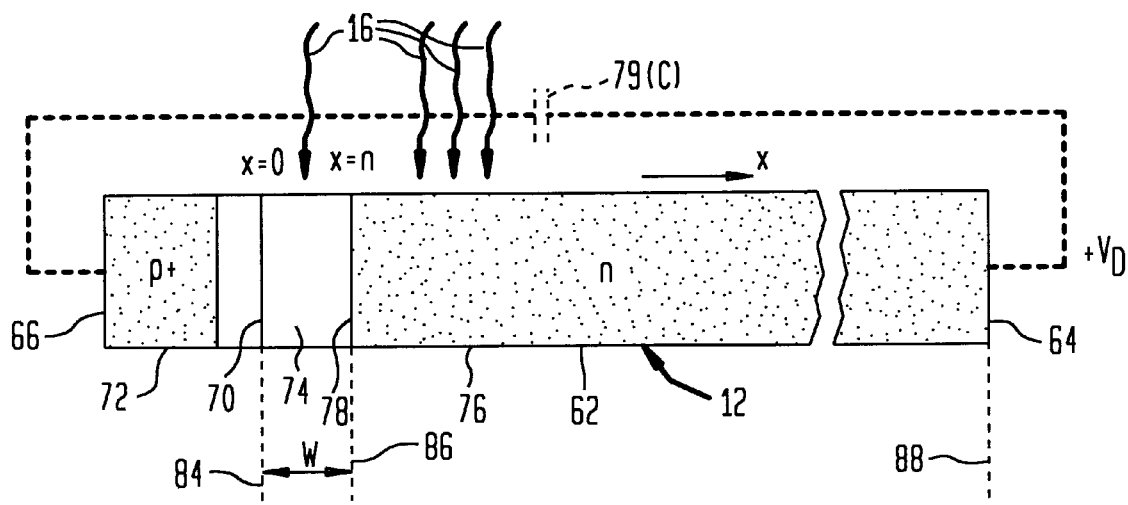
FIG. 3 is a greatly enlarged highly schematic illustration showing the DUT of FIG. 1.

Referring now to FIG. 3, there is shown greatly enlarged and in highly schematic form the DUT 12 comprising the transistor 62 shown in this simplified example as a lateral high voltage diode. Distance along the length of the DUT 12 is indicated at "x", various locations of the light beam 16 as it is scanned to the right along the DUT 12 are as indicated, and a p-n junction 70 of the DUT 12 is indicated at x=0. A first shaded area of the DUT 12 represents a p+type body region 72, an unshaded area on both sides of the P-N junction 70 represents an unsymmetrical space charge region 74, and a second shaded area represents the remainder of an n-type drift region 76.

The unshaded area (space charge region 74) represents the depletion region adjacent to the p-n junction 70 of the DUT 12 where all of the laser induced photo-generated electron-hole pairs are separated and collected by the high local field applied by the reverse bias voltage, giving rise to the OBIC photocurrent.

The second shaded area indicates a neutral n-type drift region 76 outside of the depletion region (space charge region 74) where the photo-generated carriers are not collected any more and no OBIC photocurrent is measured. Electrical connections to the DUT 12 are not shown here but are as shown in FIG. 2. The drain 64 and the source 66 of the DUT 12 are as schematically indicated in FIG. 3 at opposite ends of the DUT 12.

Within the space charge region 74 essentially all photo-generated electron-hole pairs are collected and yield a maximum OBIC photocurrent signal which is applied to the lead 50 as "Isignal" (see FIG. 2). As the scanning laser beam 16 passes across an outer edge 78 of a space charge depletion width W in the "x" direction further into the n-type drift region 76, the collected OBIC (and Isignal) begins to decay. The actual extent of the depletion width W, bounded by the edge 78, is dependent on the voltage +V of the power source 24 as will be further explained hereinafter.

The DUT 12 has an internal capacitance across its p-n junction 70. This is schematically illustrated in dashed outline in FIG. 3 by a capacitor (C) 79 which is coupled between the drain 64 and the source 66 of the DUT 12. The voltage at the drain 64 is indicated here as "$V_D$". As was mentioned previously, this voltage capacitance relationship determines the space charge region depletion width W as a function of the applied reverse bias voltage of a LDMOS transistor. The reverse bias voltage determines how many trapped positive ions can be uncovered in the graded n-type drift region and results in a fixed depletion width W for each applied voltage. The OBIC photocurrent signal on the LDMOS device under reverse bias allows the measurement of the depletion width W as a function of applied reverse bias voltage. From these measurements the corresponding dopant impurity concentration for each measured depletion width W can be obtained by means of a mathematical algorithm. This in turn allows a profiling of the dopant impurity concentration as a function of drift region distance or depletion width W in the LDMOS device (e.g., the transistor 62).

In general the relationship between impurity dopant concentration and the differential of capacitance (C) for a reverse biased p-n junction can be expressed as:

$$N_D(C) = \frac{-C^3}{qk_{s\_o}A^2[dC/dV]} \quad \text{Eq. 1}$$

where: $N_D$ is donor impurity concentration in number of donor atoms per cubic cm;

C is capacitance;

q is the basic charge of an electron;

$k_s$ is the permittivity of silicon;

_o is the permittivity of free space;

A is unit area; and

V is bias voltage

The above Equation 1 can be reformulated in a way suitable for the case of OBIC measurements to describe incremental junction capacitance as a function of reverse bias voltage in terms of the space charge depletion width W and its derivative as follows:

$$N_D(W) = \frac{-2k_{s\_o}}{q[d(W^2)/dV]} \quad \text{Eq. 2}$$

or equivalent:

$$N_D(W) = \frac{-k_{s\_o}}{qW[dW^2/dv]}$$

where the various quantities are as in Equation 1.

Figure 4:
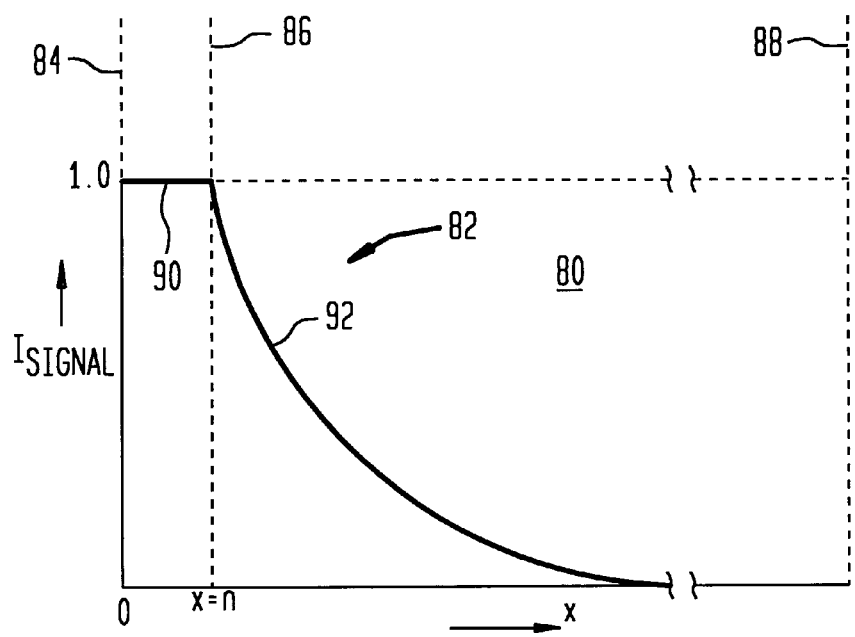
FIG. 4 is a somewhat idealized graph of measured optical beam induced current (OBIC) versus distance in an "x" direction along a length of the DUT of FIG. 3 showing a waveform of a signal (Isignal) obtained for a given supply voltage V as the optical beam scans in the "x" direction along the length of the DUT.

Referring now to FIG. 4, there is shown a graph 80 of a somewhat idealized waveform 82 of Isignal. The horizontal axis of the graph 80 represents distance in the x direction along the DUT 12 (FIG. 3). The vertical axis of the graph 80 represents the magnitude of Isignal with a normalized level of 1.0 representing the maximum measured value. A first vertical dashed line 84 between FIG. 4 and FIG. 3 designates the position of the p-n junction 70 at x=0. A second vertical dashed line 86 designates the position of the edge 78 (x=n) of the depletion width W, and a third vertical dashed line 88 represents the right end of the n-type drift region 76 of the DUT 12.

The waveform 82 has a first, generally horizontal portion 90, representing substantially constant OBIC (and Isignal) photocurrent collected in the space charge depletion width W from x=0 to x=n. The waveform 82 then has a curved portion 92 beginning at x=n and decaying generally exponentially from 1.0 to 0 within a certain number of diffusion lengths as the beam 16 scans farther and farther along the n-type drift region 76. Isignal falls to zero (0) before the right end of the n-drift region 76 is reached. The horizontal portion 90 of the waveform 82 is a measure of the depletion width W, and the length of the portion 90 in the x direction is a function of the bias voltage applied by the power source 24 (FIGS. 1 and 2) to the DUT 12. This length of portion 90 increases as the bias voltage is increased. By employing in the personal computer (PC) 34 of FIG. 1 a suitable mathematical algorithm, as is well understood by those skilled in the art, and solving for $N_D$ in Equation 2 above, a profile of dopant impurity concentration along the length of the DUT 12 is obtained. A detailed illustration of a profile of dopant impurity concentration $N_D$ in a specific transistor is given hereinafter.

Figure 5:
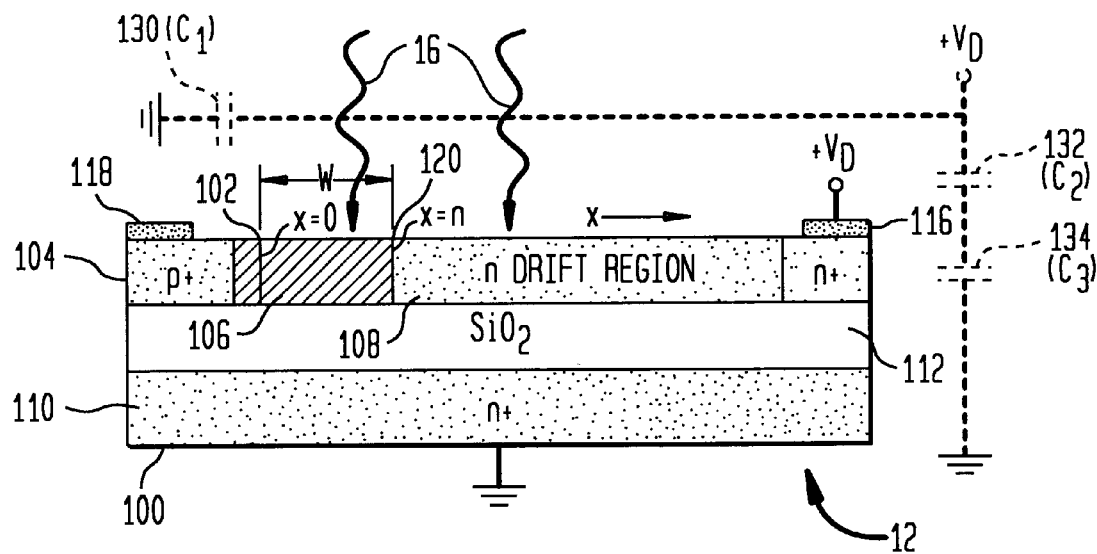
FIG. 5 is a greatly enlarged highly schematic illustration (similar to FIG. 3) of a DUT comprising a HV LDMOS transistor utilizing RESURF realized in silicon-on-insulator (SOI) technology.

Referring now to FIG. 5, there is shown greatly enlarged and in highly schematic form a HV LDMOS transistor 100 utilizing the RESURF principle for the example of silicon-on insulator (SOI) technology. It is to be understood that the transistor 100 also serves as the DUT 12 of FIG. 1 (instead of the transistor 62). Distance along the length of the transistor 100 is indicated at "x", various locations of the light beam 16 as it is scanned to the right along the transistor 100 are as indicated, and a p-n junction of the transistor 100 is indicated at 102(x=0). A first darkly shaded area of the transistor 102 represents a p+type body region 104, a lightly shaded (crosshatched) area over the p-n junction 102 represents an unsymmetrical space charge region 106, a second darkly shaded area represents an n-type drift region 108, and a third darkly shaded area represents an n+type substrate 110, which is grounded. An unshaded area represents a horizontal layer 112 of silicon oxide ($SiO_2$) separating and insulating the substrate 110 from the upper portions 104, 106 and 108 of the transistor 100. Electrical connections to the transistor 100 are not shown here but are like those shown in FIG. 2 for the transistor 62. The drain 116 and the source 118 of the transistor 100 are as schematically indicated in FIG. 5 at opposite ends of the transistor 100. Its gate (not shown) is grounded.

Within the space charge region 106 of the transistor 100 essentially all photo-generated electron-hole pairs are collected and yield a maximum signal which is applied to the lead 50 as "Isignal"(see FIG. 1). As the scanning laser beam 16 passes across an outer edge 120 of a space change depletion width W in the "x" direction farther into the n-type drift region 108, the collected OBIC (and Isignal) begins to decay. The actual extent of the depletion width W, bounded by the edge 120, at x=p-n, is dependent on the voltage +V of the power source 24 as will be further explained hereinafter.

The transistor 100 has an internal capacitance across its p-n junction 102 as schematically illustrated in dashed outline in FIG. 5 by a capacitor ($C_1$) 130 which is shown coupled between a voltage "+$V_D$" at the drain 116 of the transistor 100 and ground. Also shown in dashed outline coupled in series between "+$V_D$" and ground are a depletion layer capacitance, illustrated by a capacitor ($C_2$) 132 and an insulating layer ($SiO_2$) capacitance illustrated by a capacitor ($C_3$) 134. The area of the p-n junction 102, which determines the size of the capacitor 130, is negligibly small in comparison with the depletion layer area (and capacitor 132) and the oxide layer area (and capacitor 134). Thus capacitor 130 can be neglected, and only capacitors 132 and 134 in series need be considered.

An OBIC, and Isignal (like the waveform 82 of FIG. 4) are generated in the transistor 100 (in its role as the DUT 12) as it is scanned by the laser beam 16. As was mentioned previously, for a high voltage HV LDMOS transistor, where the RESURF condition is utilized, the space charge region is further extended in order to achieve higher breakdown voltages by simultaneously depleting vertically from the p-n junction in the device and also horizontally from a bottom oxide layer via an added capacitance. The depletion layer capacitance ($C_1$) of the p-n junction gives only a negligible contribution in this case, since the area of the p-n junction is negligible. As was explained above, the series capacitance ($C_2$ and $C_3$) formed by the device substrate and the insulating oxide layer completely dominates the depletion width W in the drift region of the transistor 100. Equation 2 above does not apply in this case. However, a further extended mathematical derivation of Equation 1, as is easily understood by those skilled in the art, permits profiling of dopant impurity concentration in the transistor 100.

The following transcendental Equation 3 is derived from general MOS capacitor relationships for the case of a silicon-on insulator (SOI) technology HV LDMOS transistor with RESURF (e.g., the transistor 100).

$$N_D = \frac{k_{ox\_o}^2 [V - (kT/q)\ln(N_D/n_i)]^2}{2d_{ox}^2 k_s q (kT/q) \ln(N_D/n_i)} \quad \text{Eq. 3}$$

where: kT/q at 300° K=$2.586 \times 10^{31}$ $^2$V;

$k_{ox}$ is the permittivity of $SiO_2$;

$n_i$=$1.5 \times 10^{10}$/$cm^3$(for intrinsic silicon);

$d_{ox}$ is the thickness of the $SiO_2$ layer; and the remaining quantities are as in Equation 1.

It will be noted that in Equation 3 the quantity $N_D$ is expressed as a function of itself. Accordingly Equation 3 is best solved for $N_D$ by successive approximations of $N_D$ starting with an assumed (guessed) value of $N_D$. The correct value of $N_D$ for a measured set of conditions will be obtained after a few iterations using successive values of $N_D$ closer and closer to the actual value, as is well known. This will be illustrated below for a specific set of iterations of $N_D$ in a particular example of dopant concentration in a transistor 100.

The following Table lists reverse bias voltages (V), depletion widths W, and dopant impurity concentrations $N_D$ in a HV LDMOS transistor with RESURF (e.g., transistor 100) as measured by the apparatus of FIG. 1 on a DUT 12 in accordance with the method provided by the invention. The thickness of the oxide ($SiO_2$) layer, such as the layer 112 of the transistor in FIG. 5, was 1.6 microns.

TABLE

| Row | Reverse Bias Volts (V) Column 1 | Depletion Width W in microns Column 2 | Dopant Concentration $N_D$ per cubic cm Column 3 |
|---|---|---|---|
| 1 | 30 | 7.72 | $3.204 \times 10^{16}$ |
| 2 | 40 | 10.47 | $5.523 \times 10^{16}$ |
| 3 | 50 | 12.01 | $8.408 \times 10^{16}$ |
| 4 | 60 | 15.45 | $1.188 \times 10^{17}$ |
| 5 | 70 | 17.85 | $1.593 \times 10^{17}$ |
| 6 | 80 | 22.31 | $2.051 \times 10^{17}$ |
| 7 | 90 | 27.46 | $2.565 \times 10^{17}$ |
| 8 | 100 | 29.52 | $3.131 \times 10^{17}$ |
| 9 | 110 | 32.96 | $3.75 \times 10^{17}$ |
| 10 | 120 | 39.14 | $4.42 \times 10^{17}$ |
| 11 | 130 | 44.97 | $5.15 \times 10^{17}$ |
| 12 | 140 | 48.41 | $5.927 \times 10^{17}$ |
| 13 | 150 | 52.79 | $6.757 \times 10^{17}$ |
| 14 | 160 | 56.65 | $7.637 \times 10^{17}$ |
| 15 | 170 | 58.71 | $8.569 \times 10^{17}$ |
| 16 | 180 | 61.12 | $9.55 \times 10^{17}$ |

In the above Table, the values of $N_D$ in Column 3 are determined by use of Equation 3. For example, the value of $N_D$ of $3.204 \times 10^{16}$ in Row 1, corresponding to a reverse bias of 30V and a depletion width W of 7.72 microns, is calculated as follows. As a first guess it is assumed the $N_D$ equals $5 \times 10^{16}$ and this value is entered for $N_D$ on the right hand side of Equation 3 for a first iteration. The resulting calculation gives $3.1073 \times 10^{16}$ for $N_D$. This latter value in a second iteration of Equation 3 results in a calculated value of $3.2114 \times 10^{16}$. Using this last value, a third iteration of Equation 3 gives a value of $3.2039 \times 10^{16}$ for $N_D$. By the end of the third iteration here the values of $N_D$ on both sides of Equation 3 are nearly identical, thus showing that $3.204 \times 10^{16}$ is the actual dopant concentration (to a sufficient degree of accuracy). Generally speaking, fewer than five, typically three, iterations in calculating $N_D$ are required to arrive at a value converging sufficiently close to the actual value.

The $N_D$ calculations of $N_D$ outlined above are performed in the personal computer (PC) 34 (FIG. 1) using a suitable mathematical algorithm, as is well understood by those skilled in the art. The additional values of $N_D$ in Rows 2–16 of the Table, corresponding to respective values of V and W, are arrived at in the same way. Column 3 of the Table is thus a profile of dopant impurity concentrations along the length of the DUT 12 (e.g., transistor 100). It should be noted that here the dopant profile increases approximately linearly with increasing length. By studying such a profile of $N_D$ (its shape, linearity, continuity, etc.) it is possible to quickly evaluate, and/or change the design and manufacturing processes by which such a transistor is made. This rapid feedback of information helps optimize final results. This is important for obtaining cost efficiency and high performance levels from the transistors being produced. It is to be understood of course, that dopant impurity concentrations for a non-SOI transistor such as shown in FIG. 3 with no substrate MOS capacitance can be obtained using Equation 2 in a similar way to construct a table (not shown) like the Table given above.

The above description is intended in illustration and not in limitation of the invention. Various changes in the apparatus described and in the method of the invention as set forth may occur to those skilled in the art, and these changes may be made without departing from the spirit or scope of the invention as set forth in the accompanying claims. In particular, the invention is not limited solely to application with the transistors illustrated in FIGS. 3 and 5, but is applicable to other semiconductor devices such as semiconductor lateral high voltage diodes as well as any other class of electronic devices amenable to p-n junction probing, Schottky barrier probing, or MOS capacitor probing by OBIC or EBIC. Also, the invention is not limited to measurement of dopant impurity concentrations which vary linearly with length along a semiconductor device.

What is claimed is:

1. A method for non-destructive measurement of dopant impurity concentrations in semiconductor devices, the method comprising: a first step of reverse biasing a device under test (DUT) with a first voltage; a second step of scanning the device with a beam of radiant energy to induce in the DUT a first signal current which varies as the beam scans along the DUT and using the induced signal current versus scanned length to measure a first depletion width (W) in the DUT; additional steps of repeating the first and second steps using a plurality of separate bias voltages and measuring respective depletion widths W in the DUT, and a final step of determining from the voltages and the widths W a profile of dopant impurity concentrations in the DUT.

2. The method of claim 1 wherein the DUT is a high voltage lateral diffused metal oxide semiconductor (HV LDMOS) transistor, the range of bias voltages extends until the onset of avalanche breakdown of a particular device, and the beam of radiant energy is a laser beam focused on the DUT through a microscope to induce thereby a photocurrent in the DUT, signals produced by the current being used to measure the depletion widths W.

3. A method for determining a profile of impurity concentration ($N_D$) along the length of a semiconductor device, the method comprising the steps of: reverse biasing the device with a voltage V which can be varied over a wide range; scanning along a length of the device with a beam of radiant energy to produce in the device a beam induced current signal; using the induced signal versus scanned length to measure a depletion width W in the device for a respective voltage V; repeating the above steps with different bias voltages to establish a series of such voltages V and respective widths W; and determining from a mathematical relationship amongst voltage V, width W, and concentration $N_D$ a profile of dopant impurity concentration $N_D$ along the length of the device.

4. A method for determining dopant impurity concentrations ($N_D$) at points along the length of a semiconductor device which has internal capacitance (C), the method comprising the steps of: reverse biasing the device with a voltage V which can be varied over a wide range until the onset of avalanche breakdown of the device; scanning along a length of the device with a beam of radiant energy to produce in the device a beam induced current signal; using the induced signal versus scanned length to measure a depletion width W in the device for a respective voltage V; repeating the above steps with different bias voltages to establish a series of such voltages V and respective widths W; and determining from interrelationships of voltage V, width W, capacitance C and dopant concentration $N_D$, the respective dopant concentrations $N_D$ at points along the length of the device.

5. The method of claim 4 wherein the device is a HV LDMOS transistor such as fabricated in silicon-on-insulator (SOI) technology utilizing a reduced surface electrical field RESURF principle, and the capacitance is comprised substantially of a substrate MOS oxide layer capacitance and a depletion layer capacitance in series resulting from the dielectrically insulated substrate.

6. A method for determining dopant impurity concentrations ($N_D$) at points along the length of a semiconductor device such as a high voltage lateral double diffused metal oxide semiconductor (HV LDMOS) transistor which has internal capacitance (C), the method comprising the steps of: reverse biasing the device with a voltage V which can be varied over a wide range; scanning along a length of the device with a beam of radiant energy to produce in the device a beam induced current signal; using the induced signal to measure a depletion width W in the device for a respective voltage V, the induced current signal having a high generally constant value within a region of the depletion width W and decaying generally to zero outside the region, the depletion width W increasing as bias voltage V in increased; repeating the above steps with different bias voltages to establish a series of such voltages V and respective widths W; and determining from interrelationships of voltage V, width W, capacitance (C) and dopant concentration $N_D$, the respective dopant concentrations $N_D$ at points along the length of the device.

7. The method of claim 6 wherein the device is a HV LDMOS transistor fabricated in SOI technology utilizing a reduced surface electrical field RESURF principle, the capacitance is comprised substantially of an oxide layer capacitance and a depletion layer capacitance in series, and the dopant concentration $N_D$ is calculated by iteration from a mathematical equation expressing $N_D$ in terms of $N_D$.

8. The method of claim 6 wherein the dopant concentrations are profiled to quickly monitor and/or change the design and manufacturing processes by which the transistor is made such that optimum costs and performance are obtained.

* * * * *